United States Patent [19]
Geis et al.

[11] Patent Number: 5,825,240
[45] Date of Patent: Oct. 20, 1998

[54] RESONANT-TUNNELING TRANSMISSION LINE TECHNOLOGY

[75] Inventors: Michael W. Geis, Acton; Elliott R. Brown, Billerica, both of Mass.; Stephen J. Eglash, Palo Alto, Calif.; Christopher L. Dennis, Baker City, Oreg.

[73] Assignee: Massachusetts Institute of Technology, Cambridge, Mass.

[21] Appl. No.: 916,829

[22] Filed: Aug. 22, 1997

Related U.S. Application Data

[63] Continuation of Ser. No. 348,358, Nov. 30, 1994, abandoned.

[51] Int. Cl.$^6$ ................................................. H03K 3/315
[52] U.S. Cl. ........................ 327/570; 327/195; 326/134; 257/25
[58] Field of Search ................................ 327/570, 170, 327/527, 567, 568, 569, 571, 195; 257/275, 480, 25, 601, 278, 355; 326/134, 135; 333/20, 164, 238, 248

[56] References Cited

U.S. PATENT DOCUMENTS

| | | | |
|---|---|---|---|
| 3,075,087 | 1/1963 | Lo ........................................... | 327/570 |
| 3,138,723 | 6/1964 | Goto ....................................... | 327/195 |
| 3,152,264 | 10/1964 | Ergott, Jr. et al. ...................... | 326/134 |

(List continued on next page.)

FOREIGN PATENT DOCUMENTS

| | | | |
|---|---|---|---|
| 63-65680 | 3/1988 | Japan ...................................... | 257/25 |
| 1-223775 | 9/1989 | Japan ...................................... | 257/25 |
| 89-304839 | 9/1989 | Japan ...................................... | 257/25 |
| 1-320816 | 12/1989 | Japan ...................................... | 327/283 |
| 855952 | 8/1981 | U.S.S.R. ................................. | 327/570 |
| 981080 | 1/1965 | United Kingdom ................... | 327/570 |

OTHER PUBLICATIONS

Nagumo, J., et al., "An Active Pulse Transmission Line Simulating Nerve Axon," *Proceedings of the IRE*, pp. 2061–2070 (Apr., 1962).

Crane, H.D., "Neuristor—A Novel Device and System Concept," *Proceedings of the IRE*, pp. 2048–2060 (Apr., 1962).

Ablowitz, M.J., et al., "Solitary Wave Collisions," *Society for Industrial and Applied Mathematics*, 36(3):428–437 (Jun., 1979).

(List continued on next page.)

*Primary Examiner*—Timothy P. Callahan
*Assistant Examiner*—Kenneth B. Wells
*Attorney, Agent, or Firm*—Hamilton, Brook, Smith & Reynolds, P.C.

[57] ABSTRACT

Resonant-tunneling transmission lines in the various architectures rely on discrete or continuous resonant-tunneling heterostructures to actively modify propagating logic signals. One embodiment utilizes amplification of logic signals to counteract ubiquitous losses and distortion associated with any transmission medium. Basically, the logic signal is incrementally reamplified and reshaped as it propagates along the transmission line. Another embodiment is directed to a clocking system that transmits a signal represented by a sinusoid. Then, in proximity to the logic gates or modules, the sinusoid is converted into a square wave that actually clocks the gates and other logic structures. The inventive active transmission line naturally performs this feature, thus enabling clock signal transmission over longer links coupled with sinusoid-to-square wave conversion in a limited area. Still other embodiments implement step or continuous variations in the physical width of the resonant-tunneling transmission line. By manipulating the transmission line width of successive sections of the line, isolation in addition to the logic operation of the input signals is achievable in a simple monolithic circuit design. Further embodiments are directed to oscillator circuits and the control of the characteristics of the generated periodic signal.

31 Claims, 11 Drawing Sheets

U.S. PATENT DOCUMENTS

| | | | |
|---|---|---|---|
| 3,205,371 | 9/1965 | Slobodzinski | 326/134 |
| 3,214,612 | 10/1965 | Hickey | 327/276 |
| 3,258,610 | 6/1966 | Balder et al. | 326/134 |
| 3,453,447 | 7/1969 | Campanella | 326/134 |
| 4,015,147 | 3/1977 | Davidson et al. | 327/566 |
| 4,345,171 | 8/1982 | Harris, Jr. | 326/30 |
| 4,675,551 | 6/1987 | Stevenson et al. | 327/545 |
| 4,956,568 | 9/1990 | Su et al. | 327/321 |
| 5,237,596 | 8/1993 | Lin | 327/570 |
| 5,264,800 | 11/1993 | Black | 327/2 |
| 5,444,751 | 8/1995 | Sage | 327/570 |

OTHER PUBLICATIONS

Crane, H.D., "On the Complete Logic Capability and Realizability of Trigger–Coupled Neuristors," (*Interin Report No. 4*) *SRI Project No. 3286, Washington DC: Office of Naval Research* (Jul., 1961).

Rodwell, M.J.W., et al., "GaAs Nonlinear Transmission Lines for Picosecond Pulse Generation and Millimeter-–Wave Sampling," *IEEE Transactions on Microwave Theory and Techniques*, 39(7):1194–1204 (Jul., 1991).

Cote, A.J., Jr., "The Tunnel Junction Neuristor," *U.S. Naval Ordnance Laboratory*, (*Report NOLTR 65–60*), pp. 1–103 (Dec., 1965).

Brown, E.R., "Resonant–Tunneling Transmission–Line Relaxation Oscillator," *OSA Proceedings on Ultrafast Electronics and Optoelectronics*, vol. 14:91–94 (1993).

Mayeda, IBM Technical Disclosure Bulletin, vol.3, No. 10, Mar. 1961.

RESONANT-TUNNELING TRANSMISSION LINE TECHNOLOGY

This application is a continuation of application Ser. No. 08/348,358, filed on Nov. 30, 1994, now abandoned, which is incorporated herein by reference in its entirety.

GOVERNMENT SUPPORT

The invention described herein was supported in whole or in part by Grant No. F19628-90-C-0002 from the Department of the Air Force.

BACKGROUND OF THE INVENTION

Demand for increased computer capability and for light weight, high bandwidth communication systems has focused attention on high speed solid state devices and circuits. Digital circuits are the focus of most development efforts and clocking speeds of some commercially available microprocessors now exceed 200 MHz. There is no fundamental reason that the trend of ever-increasing speed will abate in the near future and clock frequencies of top end microprocessors might exceed 1 GHz by the year 2,000.

Problems do arise as clock rates increase. Many kinds of loss increase with signal frequency, and signal dispersion becomes an issue as does cross-talk between adjacent signal lines. For reliable timing in digital circuits, the rise and fall time of the clocking signals must be a small fraction of the clock signal's repetition rate.

Present digital circuit technology relies on passive transmission lines to carry signals between logic gates or to route the clock around the chip. On large chips or between chips on a large multichip modules (MCM), dispersion and losses on these lines create the need for repeaters to reamplify and clean-up the signals. NMOS or CMOS repeater circuits are often used for this purpose.

In a related vein, another limitation on the speed of conventional logic is the fundamental switching speed of the transistor. Transistor-based digital circuits are used in practically all logic gates, and each transistor requires a finite time to change digital states. Combinational signals in an arithmetic logic unit of a microprocessor, for example, must propagate through large numbers of cascaded transistors for a given logic operation. These delays set lower boundaries on clock signal periods. Although faster two terminal devices are available, most combinational and sequential logic functions are more easily carried out on three terminal devices such as transistors.

SUMMARY OF THE INVENTION

Central characteristics of the present inventions and respective embodiments revolve around transmission lines constructed from N-type negative differential resistance devices. Various architectures are described herein as implementing discrete or continuous resonant-tunneling heterostructures. These heterostructures are not considered critical since the N-type NDR is the feature on which the embodiment's operation is based.

One embodiment utilizes amplification of logic signals to counteract ubiquitous losses and distortion associated with any transmission medium. Basically, the logic signal is incrementally reamplified and reshaped as it propagates along the transmission line. In one architecture, the resonant-tunneling heterostructure is continuous along the length of the line. As a result, the signal propagation essentially occurs across the heterostructure itself.

Other embodiments rely on the signal shaping characteristics of the inventive active transmission line. Conventional logic utilizes square wave signals or step functions to represent the dual logic states. This feature is not surprising in view of the two state operation of switching transistors. Square waves and step functions, however, do not transmit well along passive lines over long distances. Their substantial high frequency components, exposed by Fourier decomposition, are susceptible to various degrees of attenuation, which degrades the effectiveness with which the signal can initiate transistor switching. Sinusoids are more easily transmitted—their single frequency subjects the signal to attenuation only. An embodiment is directed at a clocking system that transmits a signal represented by a sinusoid. Then, in proximity to the logic gates or modules, the sinusoid is converted into a square wave that actually clocks the gates and other logic structures. The inventive active transmission line naturally performs this feature, thus enabling clock signal transmission over longer links coupled with sinusoid-to-square wave conversion in a small area.

Still other embodiments implement step or continuous variations in the physical width of the resonant-tunneling transmission line. Isolation provided by uni-directional signal propagation is required in many applications. Reflections at junctions, bends or variations in characteristic impedance create reflections that can interfere with logic operations. By manipulating the transmission line width of successive sections of the line, isolation in addition to the logic operation on the input signals is achievable in a simple monolithic circuit design.

Further embodiments are directed to oscillator circuits and the control of the characteristics of the generated periodic signal. It is known in the art that a resonant tunnel device can be used in combination with a short-circuited passive transmission line (not the inventive transmission line) to realize a relaxation oscillator. Adaptations of this basic design are discussed that enable single-polarity impulse, or alternatively, square wave generation.

In general according to one aspect, the invention features a tunneling device transmission line. This transmission line comprises tunneling device pairs which include: 1) a first tunneling device connected between a supply voltage terminal and a junction or node, and 2) a second tunneling device connected between the junction or node and a ground voltage terminal. For example, these devices can be resonant-tunneling diodes. Transmission line segments are then used to interconnect the junctions of successive ones of the tunneling device pairs.

The device pairs are ideally biased for bi-stable operation. Then, the devices change states in response to receipt of logic signals via the transmission line segments. Specifically, the second tunneling device of each device pair functions as a switching diode, and the first tunneling device of each device pair serves as a resistive load to d.c. bias the second.

In general, according to another aspect, the invention features a negative differential resistance device transmission line, in a monolithic implementation. This transmission line comprises a negative differential resistance device junction and a signal line for transmitting logic signals representing the information along a length of the negative differential resistance device junction. A supply voltage line and a ground voltage line provide biasing to the negative differential resistance device junction. Conductive links are established between the signal line and the ground line, and between the signal line and the supply voltage line.

In specific embodiments, regions of the negative differential resistance device junction have been inactivated to provide discrete resonant-tunneling diodes along a length of the signal line.

In general according to still another aspect, the invention features a resonant-tunneling transmission line, in a different architecture. The transmission line comprises a resonant-tunneling heterostructure and a signal line, vertically aligned over the heterostructure, for transmitting logic signals. A bias voltage line is vertically aligned under the resonant-tunneling heterostructure to carry a biasing voltage for the resonant-tunneling heterostructure.

In specific embodiments, a supply voltage line is adjacent to the signal line and provides a supply voltage to the signal line through a resistive load. If discrete devices are implemented, inactivated portions of the resonant-tunneling heterostructure are created to form discrete resonant-tunneling diodes along the length of the resonant-tunneling transmission line.

According to another aspect, the invention features a distributed computer system. This system comprises computing modules adapted to perform computations and exchange information with each other. A negative differential resistance device interconnect is implemented to transmit the information between the computing modules. This interconnect relies on a tunneling diode biased to facilitate transmission of logic signals, representing the information, through the interconnect. Ideally, the tunneling device interconnect is formed in a semiconductor substrate and the computing modules are mounted to the semiconductor substrate.

The interconnect is preferably formed from resonant-tunneling device transmission lines. These transmission lines can be formed from a resonant-tunneling device heterostructure. A signal line is then used to transmit the logic signals representing the information along this heterostructure. A supply line and a ground line provide biasing to the heterostructure and conductive links between the signal ground and supply line provide the biasing to the junction. In an alternative architecture, the resonant-tunneling device transmission lines comprise a resonant-tunneling device heterostructure. A signal line is then vertically aligned over the heterostructure to transmit the logic signals representing the information. A bias voltage line is then vertically aligned underneath the heterostructure and carries a biasing voltage to the heterostructure. Some architectures support a continuous active heterostructure along the entire length of the transmission line. Alternatively, to conserve biasing current and increase speed, portions of the heterostructure can be inactivated to thereby form discrete resonant-tunneling diodes along the length of the transmission line. The inactivation can be initiated by proton implantation.

In general, according to still another aspect, the invention features a process for manufacturing a co-planar tunneling transmission line. This process comprises first forming a tunneling diode heterostructure on a substrate. A signal line, a ground line, and a supply line are then also formed on the substrate. Conductive links are then established between the signal line and the ground and supply voltage lines to provide biasing to the heterostructure.

In specific embodiments, the signal line is formed directly over the tunneling diode heterostructure. The ground and supply voltage lines can then be formed on either side of this signal line.

When the tunneling diode heterostructure is initially formed along the length of the transmission line, it is totally active, conductive. To form discrete diodes along the length of the transmission line, portions of the heterostructure can be inactivated by proton implantation. This yields discrete diodes along the length of the transmission line.

According to still another aspect, the invention features a tunneling diode function generator. This generator comprises a short-circuited transmission line. The tunneling diode is then placed in series with this transmission line and a biasing circuit provides a bias voltage to the tunneling diode. A transistor receives the a.c. current transmitted by the tunneling diode to generate periodic impulse signals. To generate more general functions, the short circuited transmission line can include a stub line to modify the original impulse signal.

According to still another aspect, the invention features tunneling device logic gates. These logic gates receive logic signals on at least two input lines. Tunneling device transmission line isolators are placed on these input lines to provide uni-directional signal propagation into the logic gate. A tunneling device transmission line junction then is used to logically combine these logic signals from the input lines. These isolators are created forming a tunneling device transmission line having a stepped cross-section. This configuration inhibits signal propagation from a portion of the transmission line having a narrow cross-section to the other portion of the transmission line which has a step-wise wider cross-section. This is why propagation occurs from the low impedance side to the high impedance side, but not vise versa. Using this basic configuration, both AND and OR logic operations can be implemented.

Still a further aspect of the invention is directed to a clock signal reconstituting system for a computing device. This system relies on generating a clock signal that coordinates communications between modules of the computing device. Negative differential resistance device transmission lines are then implemented with each module to convert the clock signal into a square wave for controlling the modules. As a result, the clock signal can be as easily generated as a sinusoid, for example. Distortion and dispersion associated with this sinusoid will be less than for the same frequency square wave and consequently can be more easily transmitted to the modules. Then, locally at the modules, a synchronous square wave clock signal is generated using the negative differential resistance device transmission lines.

Still another aspect of the invention features a variable velocity data transmission line. This includes a resonant-tunneling transmission line for transmitting data and the series combination of a capacitance and resistance that provides an a.c. path to ground and is selectively coupled to the transmission line. The resistance is chosen to damp the gain associated with the resonant-tunneling transmission line to effectively slow and/or freeze the propagation of logic signals along a signal line of the transmission line. In preferred embodiments, the capacitances are provided by Schottky diodes.

The above and other features of the invention including various novel details of construction and combinations of parts, and other advantages, will now be more particularly described with reference to the accompanying drawings and pointed out in the claims. It will be understood that the particular method and device embodying the invention is shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same or related parts throughout the different views.

The drawings are not necessarily to scale; emphasis has instead been placed upon illustrating the principles of the invention. Of the drawings:

FIG. 1a shows a resistively biased RTD, FIG. 1b shows the I-V curve for the circuit of FIG. 1a, FIG. 1c shows a switching RTD biased by a second RTD, $V_{supply}$=2.1 V, FIG. 1d shows a I-V curve for the circuit of FIG. 1c, FIG. 1e shows a switching diode biased by a second RTD, $V_{supply}$=1.25 V, and FIG. 1f shows an I-V curve for the circuit of FIG. 1e;

FIGS. 6a, 6b, and 6c is a lateral cross-sectional view illustrating some of the steps of an inventive process for fabricating the first architecture resonant-tunneling transmission line of FIG. 5a;

DETAILED DESCRIPTION OF THE DRAWINGS

One common class of negative-differential-resistance (NDR) devices are the tunnel diodes. These quantum-transport devices have an N-type NDR region in which current through the device will decrease precipitously for marginal increases in voltage across the diode. Homojunction Esaki tunnel diodes have been available for decades. More recently, resonant-tunneling devices, specifically diodes (RTDs), have become available and their characteristic heterostructure is readily realizable in integrated circuits through the use of modern fabrication techniques. The RTD is particularly useful in many applications because the NDR region is present at room temperature in many different material systems and over a very wide range of current densities.

The NDR region is a key quality of the diodes since it enables bistability—and thus, suggests logic operations. The advantage of the RTD over conventional logic approaches, however, is that the active region of the device couples directly to a quasi-TEM mode of transmission lines. This coupling greatly reduces the deleterious effects of interconnections, which can easily limit the speed of logic devices in a conventional circuit because of the reactive loading effect of the interconnect capacitance.

Figure 1A:
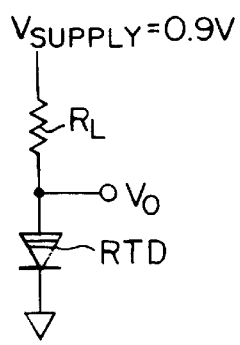
FIGS. 1a–1f show three bi-stable circuits implementing resonant-tunneling diodes (RTD)
Figure 1B:
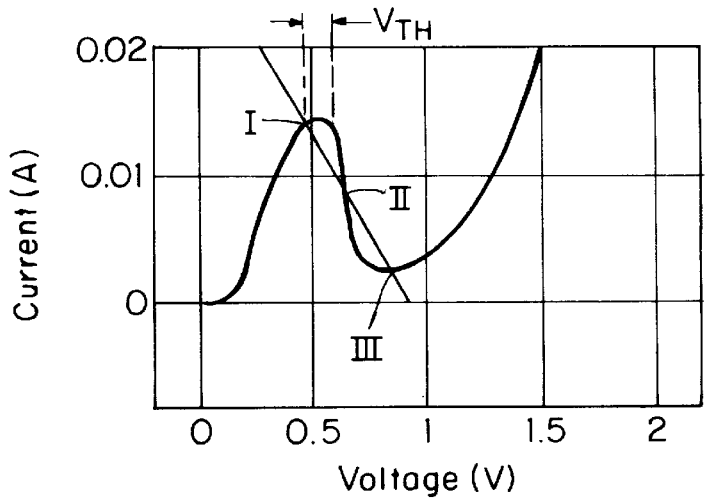

FIGS. 1a through 1f illustrate how a bistable circuit is constructed from an N-type NDR device such as a tunnel diode, specifically an RTD. A load resistor $R_L$ (45 Ω) and an RTD, in FIG. 1a, are connected in series between a voltage source $V_{supply}$ and ground. FIG. 1b shows the load resistor $R_L$ characteristic superimposed over the N-type NDR I-V curve of the RTD. These curves overlap each other in three places (I, II, III). Only points I and III are both d.c. and a.c. (unconditionally) stable, point II being metastable, (i.e. a.c. unstable). As a result, the circuit has only two sustainable points of operation. For a fast RTD, $V_D$ can shift between points I and III in a few picoseconds.

The resistor $R_L$ is not a critical component for the bistability. Any element with a roughly equivalent resistance can be used in place of the resistor $R_L$. In fact, the difficulties associated with reliably constructing resistors in monolithic circuits make the circuit of FIG. 1a generally undesirable.

Figure 1C:
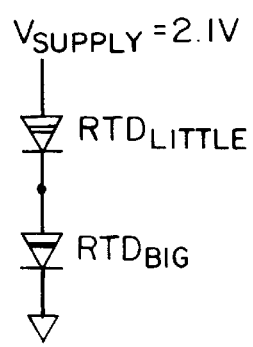
Figure 1D:
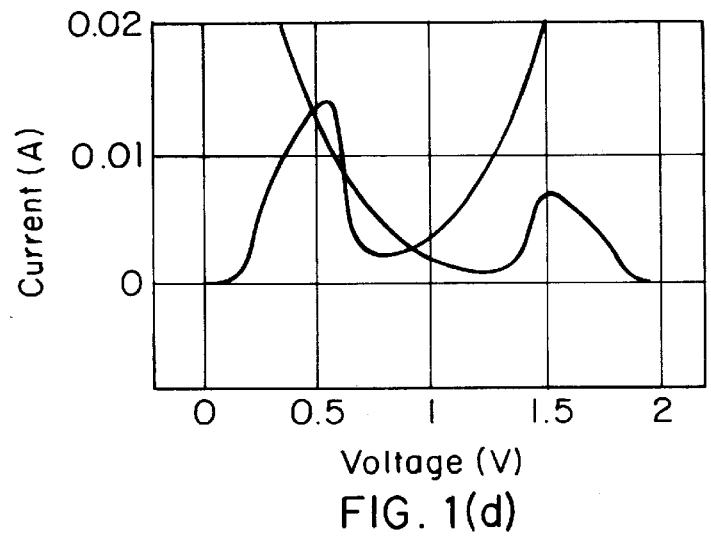

FIG. 1c utilizes a large-area RTD and a small-area RTD connected in series. The small-area RTD, biased past its valley point functions as a non-linear load resistor, and the expected switching time will be very close to that of the resistively loaded structure of FIG. 1a. The ratio of the areas of the two devices is very important. For a circuit having the characteristics illustrated in FIG. 1d, the ratio of the area of the large to small RTD must be between 1.2:0 and 3.0:1 for bistability.

Figure 1E:
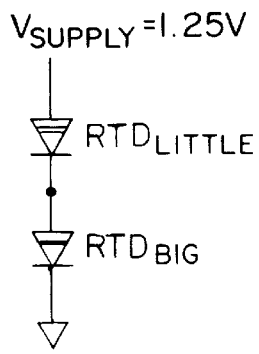
Figure 1F:
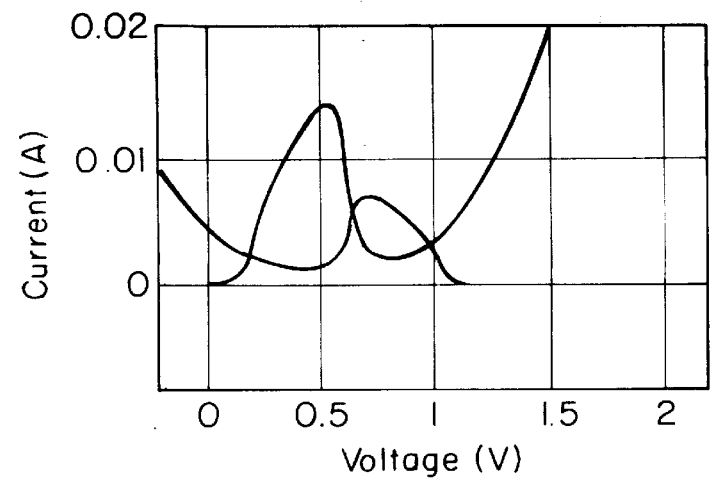

Greater voltage swings and lower static power dissipation are achieved with the configuration shown in FIG. 1e. In this case, a different supply voltage, 1.25 V, is chosen, which yields I-V curves shown in FIG. 1f.

A first embodiment of the present invention is a computer interconnect. A principle problem associated with any computer interconnect—whether the interconnect is a crossbar, bus or other type connecting a single central processor to hierarchically dependent devices, or in the context of a distributed multi-coprocessor architecture such as a HYPERCUBE model, for example—is that the speed of the signals transmitted across the interconnect is constrained by the physical size of the interconnect. The time allocated to each transaction involving the interconnect must accommodate its physical length. This factor limits the communication bandwidth of the computer in all but the shortest communication paths. Further, logic signals, usually square wave or step functions, are detrimentally impacted by dispersive and distortive effects that tend to degrade these signals over long signal paths.

Modern distributed-multiprocessor computer modules overcome problems associated with rigid bus architectures by replacing the bus with a myriad of separate channels, or interconnect segments, extending between computing modules. This distributed configuration avoids the distances and signal congestion associated with bus architectures. The physical length of the interconnect segments, however, still exceeds the connection length within each computing module by several orders of magnitude. As a result, computer clock cycles must be dedicated to waiting for signal transmission between the computer modules, or clock periods must be unnecessarily lengthened to account for delays associated with signal propagation and repeater hardware that is included to counteract dispersion and distortion on these communication paths.

Distributed computer interconnects are also generally responsible for providing a common clock signal to each of the computational modules. The physical speed of this clock signal, even when each module may have an independent clock controlling intra-module processing, dictates the speed of the inter-module communications. Clock skew associated with propagation times across the distributed computing system, coupled with degradation of the cock signal itself, places an overall ceiling on the frequency of and reliance on this clock.

Figure 2:
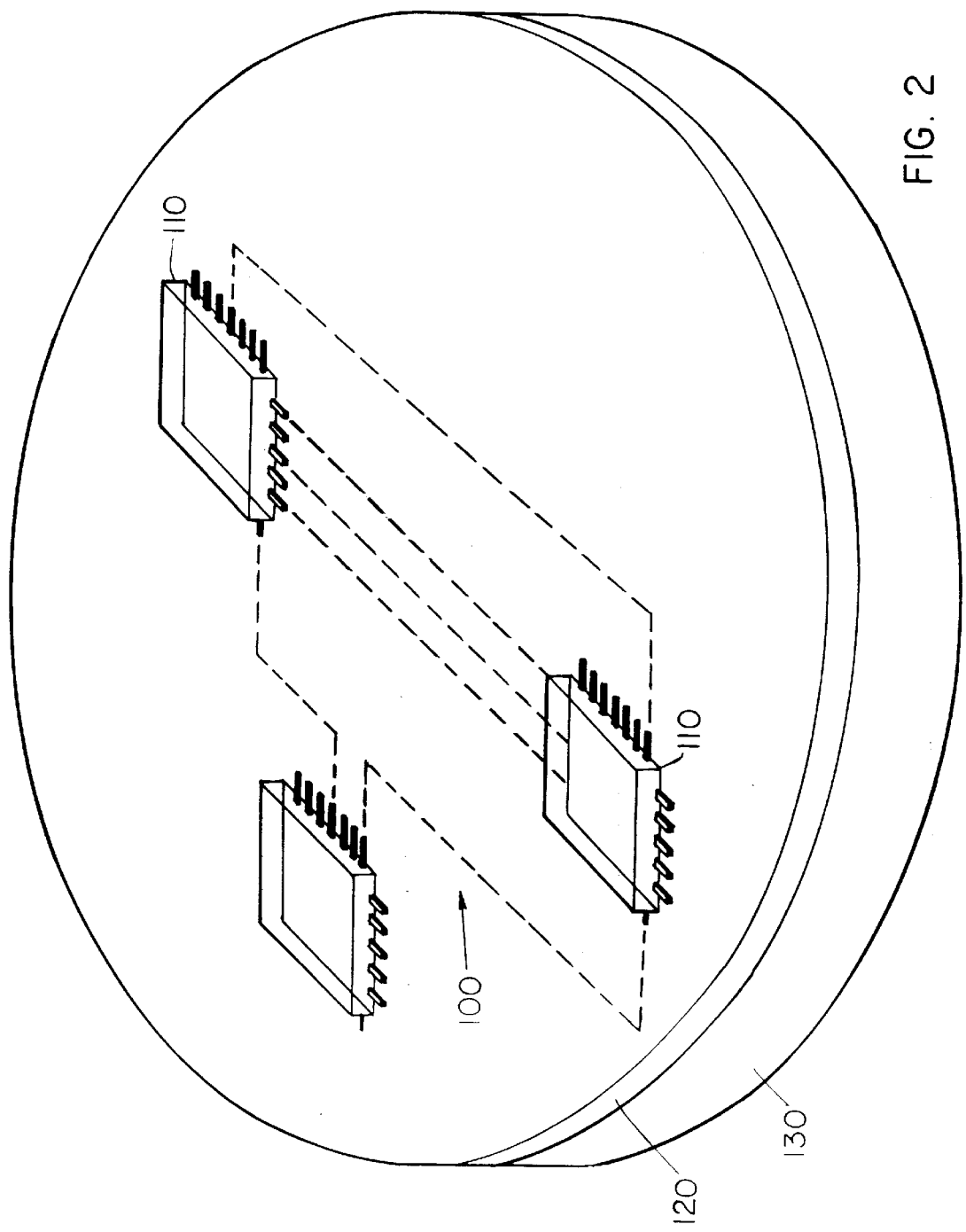
FIG. 2 schematically illustrates a distributed massively parallel computer, including microprocessor chips 110 and interconnects 100, located on a semiconductor substrate 130 according to the present invention.

Referring to FIG. 2, the inventive NDR device, or specifically resonant-tunneling, transmission line interconnect 100 provides a connection between computational modules 110 of the distributed computer. Note that only a few modules are illustrated though at least tens of such modules may be combined in an orthogonal array. These modules 110 are nominally separate microprocessor chips, such as one of the INTEL 80×86 series, which can be individually configured to cooperatively perform complex calculations. Alternatively, the interconnect 100 can also function as a bus to connect dependent devices to a central processing unit or controller. The modules 110 are preferably silicon based chips mounted on a GaAs epitaxial layer 120 formed on a GaAs or Si wafer 130. The interconnect 100 is then fabricated directly in the top GaAs epitaxial layer 120.

Figure 3:
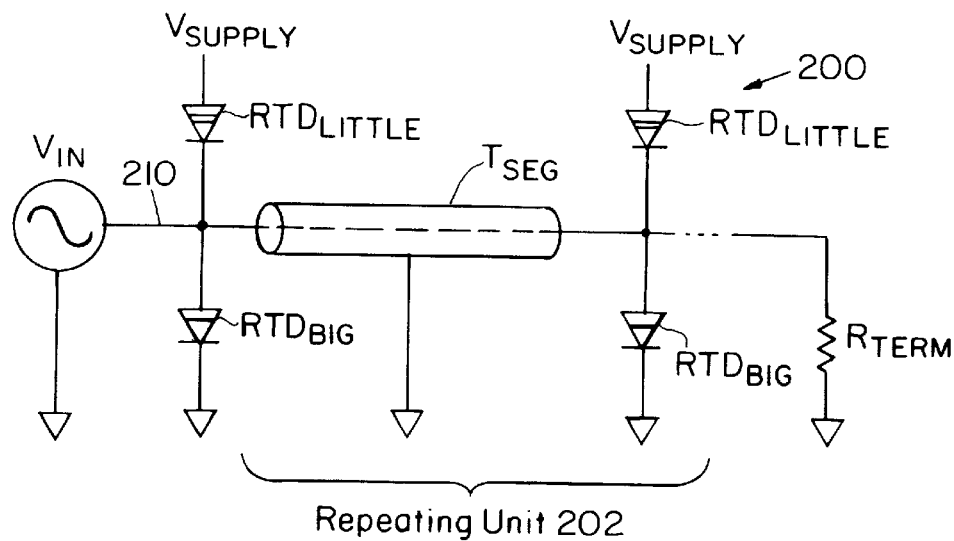
FIG. 3 is a circuit diagram of the resonant-tunneling transmission line 200 of the present invention from which the interconnect 100 is constructed.

The interconnect 100 is constructed from resonant-tunneling transmission lines 200, a circuit of which is schematically illustrated in FIG. 3. Here, a digital signal source $V_{IN}$ originating at a computational module 110 or universal clock source of a distributed computer, for example, generates an input signal on a signal line 210 at junctions between a plurality of resonant-tunneling-diode pairs, $RTD_{LITTLE}$, $RTD_{BIG}$. These diode pairs, comprising a load diode $RTD_{LITTLE}$ and switching diode $RTD_{BIG}$, are set up for bistability by adjusting the d.c. bias and by appropriate selection of their respective surface areas in conjunction with the level of the voltage $V_{supply}$ as described previously in connection with FIGS. 1a–f. A diode pair $RTD_{LITTLE}$, $RTD_{BIG}$, combined with a connecting transmission line segment $T_{seg}$ form a repeating unit 202 that is duplicated along the length of the transmission line 200.

The resonant-tunneling transmission line 200 facilitates the effective lossless and dispersionless propagation of logic signals by essentially re-amplifying a logic signal as it successively initiates the switching of the switching diodes $RTD_{BIG}$ along the length of the transmission line 200. For example, in the context of positive logic levels, a current-voltage relationship of all of the switching diodes $RTD_{BIG}$ of the transmission line 200 corresponds to point I of FIG. 1a in the quiescent state. A high logic level or voltage signal subsequently generated by the voltage source $V_{IN}$ causes each of these switching resonant diodes $RTD_{BIG}$ to switch to a state corresponding to point III. The resulting drop in current through the RTDs causes the voltage of the diode interface or junction $V_D$ to be pegged at point III. As a result, assuming proper biasing along the length of the resonant-tunneling transmission line 200, the propagating logic signal initiates discharge of available energy into the signal line 210. This scenario duplicates itself as the high voltage signal propagates to the right and appears at the junctions of successive diode pairs.

The voltage level of the logic signal is not deteriorated by radiation, distortion, or any dispersive effects of parasitic capacitances or inductances. At every junction of a RTD pair, the bi-stable operation of the diodes rejuvenates the high logic signal.

The transmission line 200 also exhibits a certain level of noise immunity. Referring back to FIG. 1b, in order to initiate discharge, the propagating logic signal must contain enough energy to increase $V_D$ by a threshold voltage $V_{th}$. Any signal with insufficient energy will not cause the switching of the RTDs and will therefore be suppressed. This suppression effect also determines the maximum distance between successive diode pairs and the length of transmission line segments $T_{seg}$. The desired level of noise immunity dictates the threshold voltage $V_{th}$. The cumulative losses of the logic signal propagating between diode pairs can not be so great as to erode the signal to a level that is incapable of overcoming the threshold voltage at the next diode pair.

Figure 4:
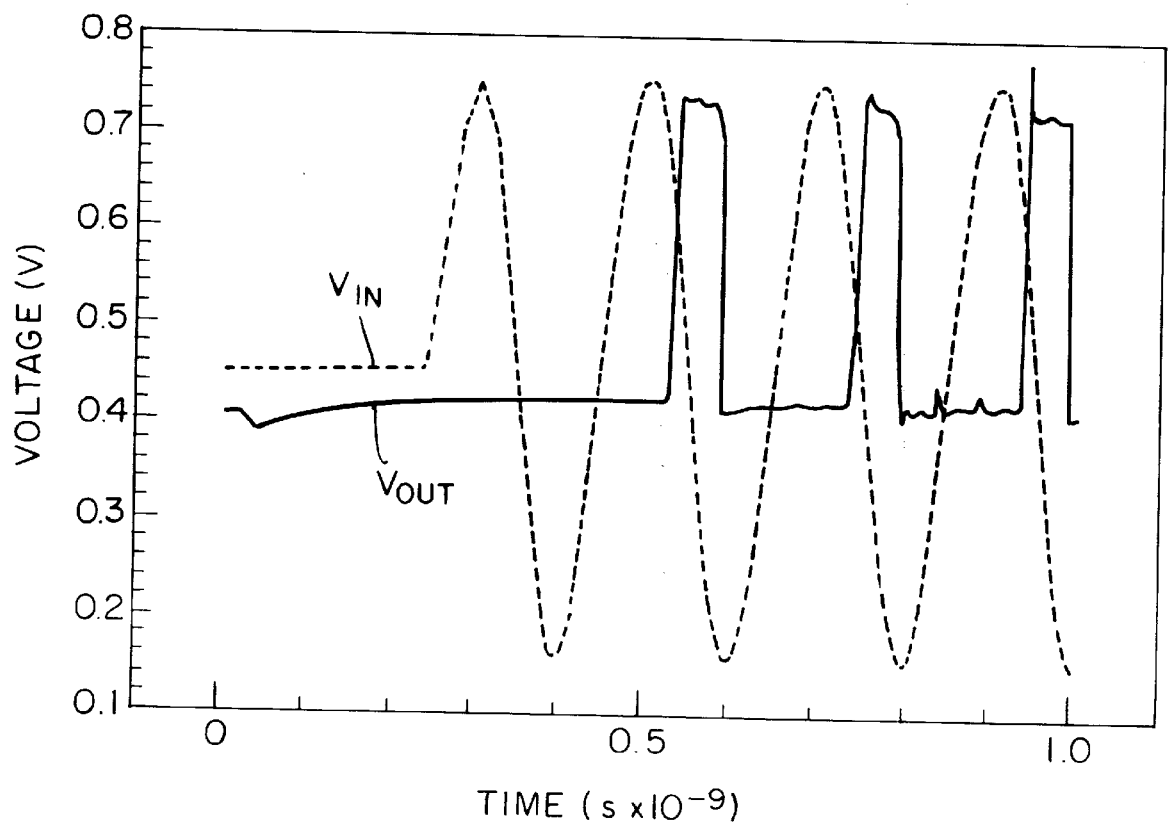
FIG. 4 is a plot of the response of the resonant-tunneling transmission line 200 to a sinusoidal input signal.

The resonant-tunneling transmission line 200 actually "cleans up" the logic signals it transmits. Referring to FIG. 4, a simulation was run in which a sinusoid input $V_{IN}$ (broken line) was applied to a circuit model of the transmission line 200. The resulting output $V_{OUT}$ (solid line) closely matches an ideal square wave.

Figure 5A:
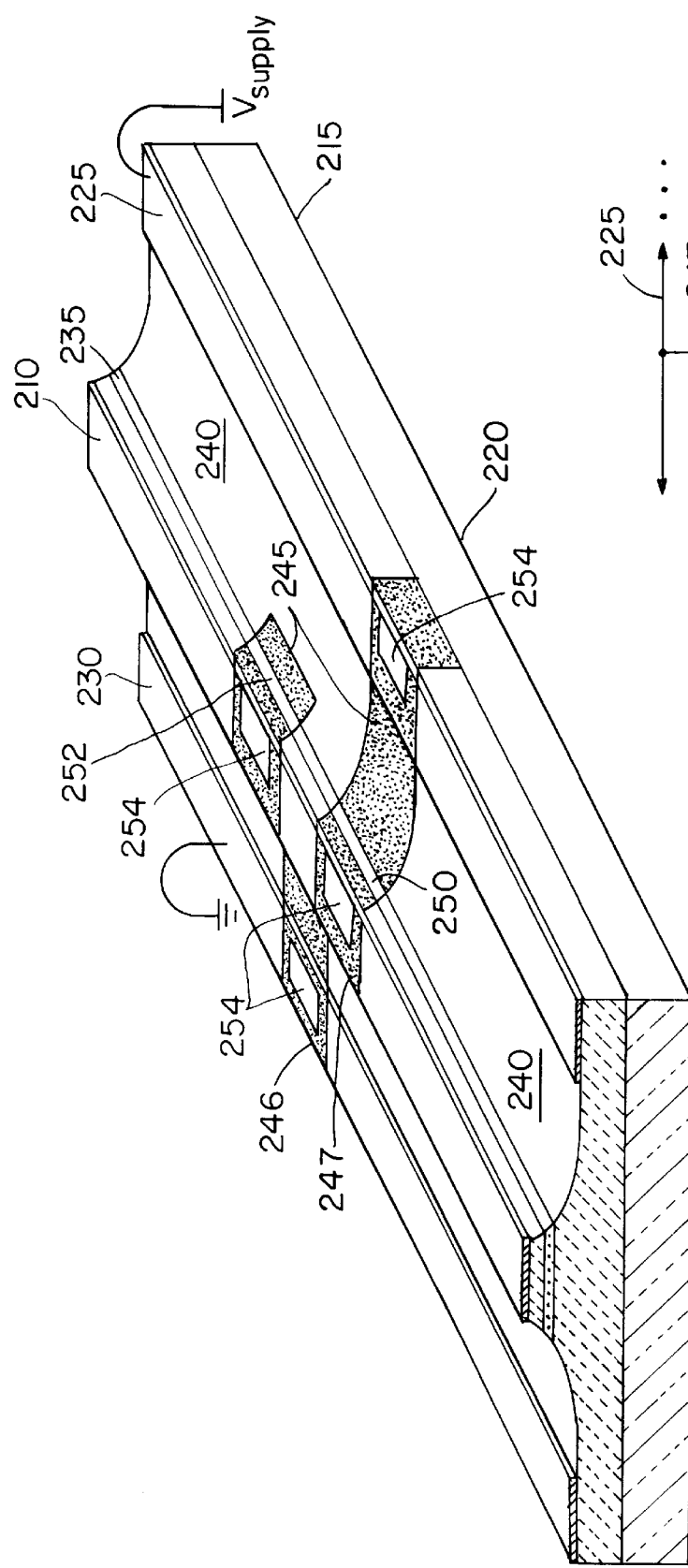
FIG. 5a is a perspective view of a first architecture of the resonant-tunneling transmission line 200 of the present invention.
Figure 5B:
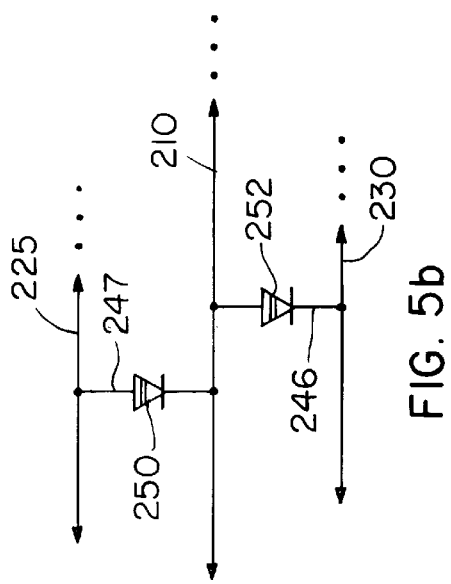
FIG. 5b is an equivalent circuit diagram in which the same reference numbers are used.

FIG. 5a illustrates a first architecture of the resonant-tunneling transmission line 200 as a computer interconnect 100. FIG. 5b is the equivalent circuit diagram using the same reference numerals for easier orientation. This first embodiment uses a coplanar waveguide configuration with signal transmission occurring on the metal signal line 210 running down a center ridge of gallium arsenide (GaAs) 205. The ridge 205 contains a double barrier heterostructure and is proton bombarded where RTDs are not desired. The structure is formed from $n^+$ doped GaAs 215 grown by molecular beam epitaxy (MBE) or metal organic chemical vapor disposition (MOCVD) on a semi-insulating GaAs substrate (SI-GaAs) 220. Two metal conductors 225, 230 run parallel to the signal line 210 to provide d.c. bias and a.c. ground for the transmission line. Specifically, a supply voltage line 225 provides d.c. bias and an a.c. ground to the signal line 210 while the second line 230 is at a ground potential.

A double-barrier heterostructure 235 exists along the entire GaAs ridge 205. Most of this structure, however, has been rendered inactive, or non-conductive, by hydrogenion H+ proton implantation, see 240, except for regions 245. Conductive strips 246, 247 and active RTD elements 250, 252 have been left connecting the signal line 210 to both the supply line 225 and the ground line 230 via the active RTDs 250, 252. Ohmic contacts 254 are formed between the signal line 210 and the active portions 245 of the n+ GaAs.

Figure 6A:
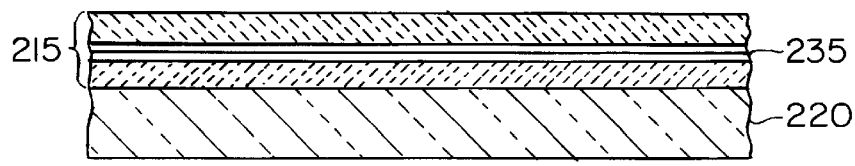
Figure 6B:
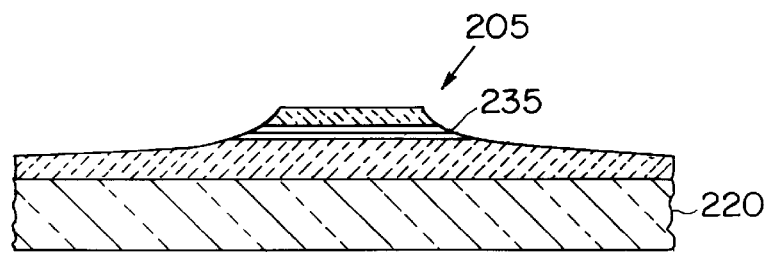
Figure 6C:
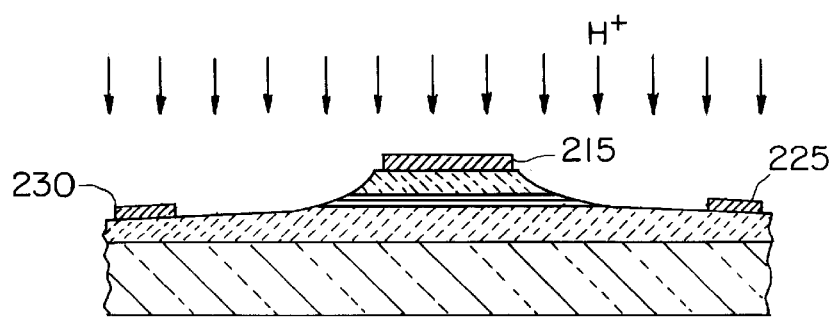

Turning now to FIGS. 6a–c, a few steps of the process for forming the first architecture resonant-tunneling transmission line are illustrated. First, as illustrated in FIG. 6a, doped GaAs 215 including a double barrier heterostructure 235 is grown over the surface of a semi-insulating GaAs substrate 220. This step can be accomplished by MBE or MOCVD.

As shown in FIG. 6b, an etch of the doped GaAs 215 is performed to create the GaAs ridge 205. This etch is a timed isotropic etch performed using a photoresist as an etch mask. After the etching step, proton bombardment, FIG. 6c, is used to inactivate, or render substantially non-conductive, most of the remaining doped GaAs 215, including all of the ridge 205 except the discrete active RTDs 250,252. As best shown in FIG. 5a, only alternating strips 245 of the doped GaAs layer 215 are left active between the signal line 210 and the ground line 230 (see strip 246), and between the signal line 210 and the supply voltage line 225 (see strip 247).

As shown in FIG. 6c, once the proton implantation has occurred, the signal line 210, supply voltage line 225, and ground line 225 are formed by a metalization process. These metal strips are to the remaining doped GaAs layer 215.

Figure 7:
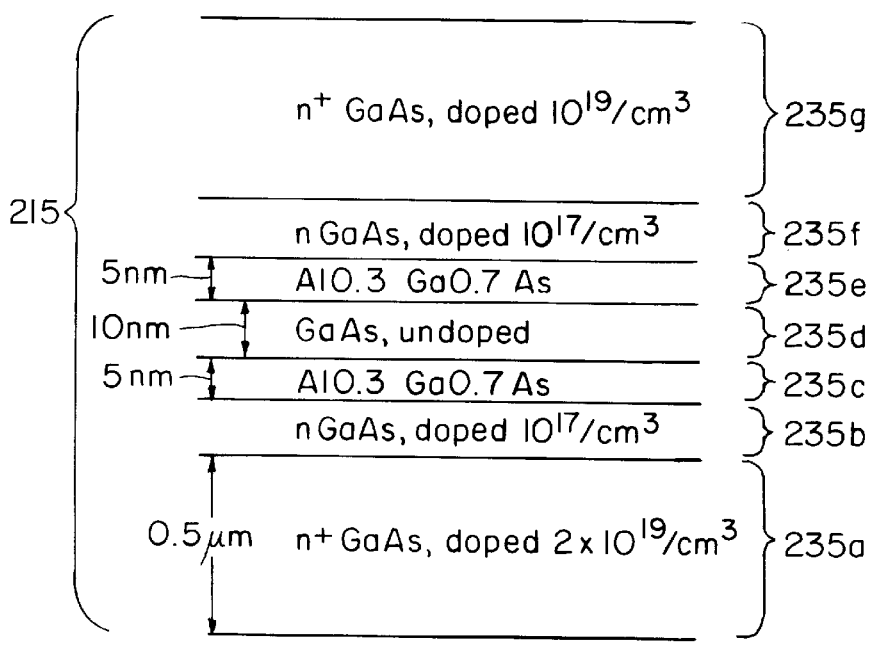
FIG. 7 shows one possible set of the doping concentrations and layer thicknesses of the doped GaAs layer 235 that is grown on the substrate 220 of the inventive transmission line 200 to form the double-barrier heterostructure of a resonant-tunneling diode.

The double barrier heterostructure 235 of the RTDs is formed by controlling the composition and dopants during this growing process. As better illustrated in FIG. 7, approximately 0.5 μm layer of n+ GaAs 235a is grown at a doping concentration of approximately $2\times10^{19}/cm^3$. On top of this first layer 235a, a second layer 235b of n GaAs is grown doped to a concentration of $10^{17}/cm^3$. Next, two layers 235c, 235e of AlGaAs are grown separated by a center layer 235d of undoped GaAs. Specifically, the two layers 235c 235e have a chemical composition of $Al_{0.3}Ga_{0.7}As$ and a thickness of approximately 5 nm. The center layer 235d, which separates the AlGaAs layers 235c, 235e, is approximately 10 nm thick. After these layers, a third layer 235f of n GaAs doped to approximately $10^{17}/cm^3$ is grown followed by a fourth and final layer 235g of n+ GaAs doped to approximately $10^{19}/cm^3$. The second and third layers 235b, 235f prevent ballistic overshoot and also form a diffusion buffer for the heterostructure to block dopant diffusion from the n+ GaAs layers 235a, 235g.

Figure 8:
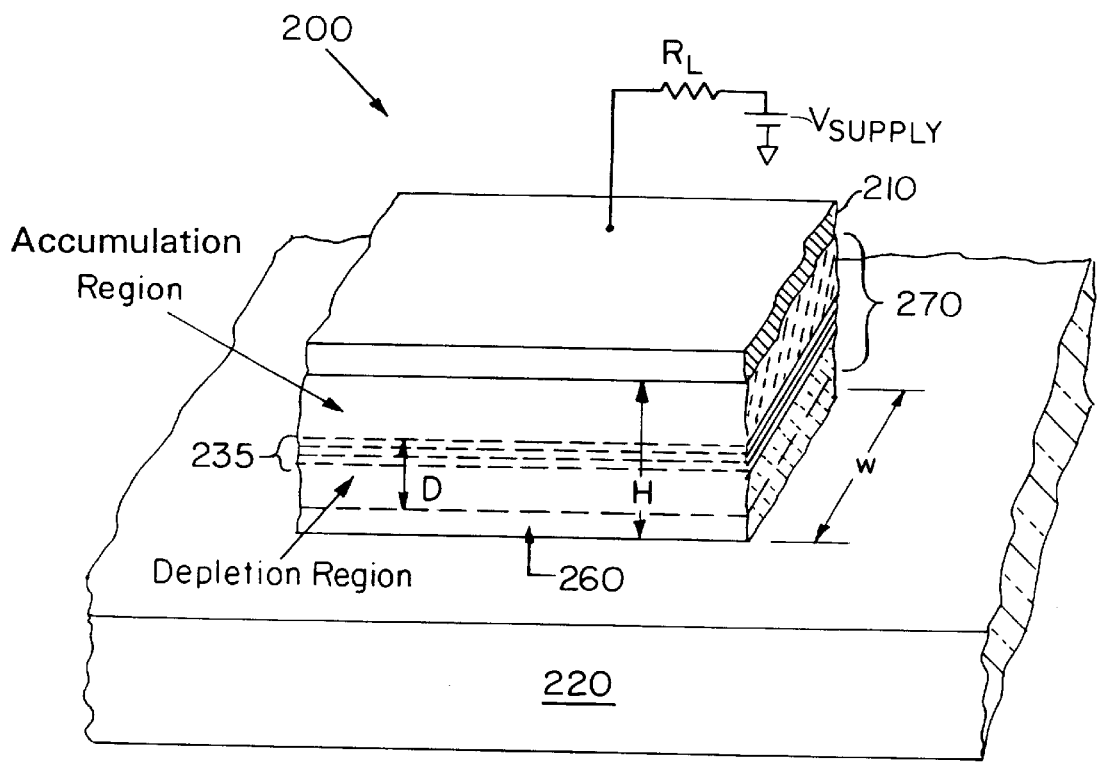
FIG. 8 is a perspective view of a second architecture of the resonant-tunneling transmission line 200 of the present invention implementing a continuous resonant-tunneling heterostructure rather than discrete sections.

FIG. 8 shows a second architecture of a monolithic implementation of the resonant-tunneling transmission line 200. This architecture implements a continuous switching diode in a heterostructure 235 along the line's length, which is vertically aligned with a signal line conductor 210 and ground voltage conductor 260. High-frequency signals, such as logic data or clock signals, are carried on the signal line 210 situated on a ridge 270 of GaAs. The GaAs ridge 270 is formed to provide continuous accumulation and depletion regions of a resonant-tunneling structure. A double-barrier heterostructure separates these two regions. Electromagnetic fields are confined by the metallic signal line 210 on top and an n++ epilayer 260 on the bottom, yielding a microstrip-like structure. The transmission line 200 is grown on a high-resistivity substrate and isolated by mesa isolation, as shown, or by ion bombardment.

More specifically, the n++ epilayer 260, a GaAs layer that has been doped for maximum conductivity, is grown on a semi-insulating GaAs substrate. Other material systems are possible, however. For example, AlGaPAs is a possibility, as is SiGe grown on a silicon substrate. Over the epilayer 260, the RTD structure is then formed. The layer width and doping concentrations are generally the same as those set forth in FIG. 7. The difference is that the bottom n++ doped GaAs layer 235a in the first embodiment merely serves as a short length conductor to the metal ground and supply voltage lines 225, 230. In the second embodiment, the n++ epilayer 260 serves as the ground voltage line. As a result, its conductivity must be higher suggesting higher doping concentrations. Finally, the signal line 210 is then formed by a metalization process having an ohmic contact to the top of the GaAs ridge 270.

Preferably in this second embodiment, the overall height of the ridge H≈5,000 Å; and D, the thickness of the depletion regions and superlattice, is approximately 2,500 Å. The width W should be greater than or equal to 1 μm. From these specifications the signal propagation velocity v through the transmission line can be estimated:

$$v=(L'C')^{-\frac{1}{2}}$$

wherein L' and C' are the inductance and capacitance per unit length.

$$L'\approx\mu H/W,\ C'\approx\epsilon\ W/D$$

$$\mu\approx\mu_0=4\pi\times10^{-7} \epsilon\approx\epsilon_r(\epsilon_0))\approx13\times8.85\times10^{-12}.$$

From these equations, the propagation velocity is approximately $6\times10^9$ cm/s.

Figure 9:
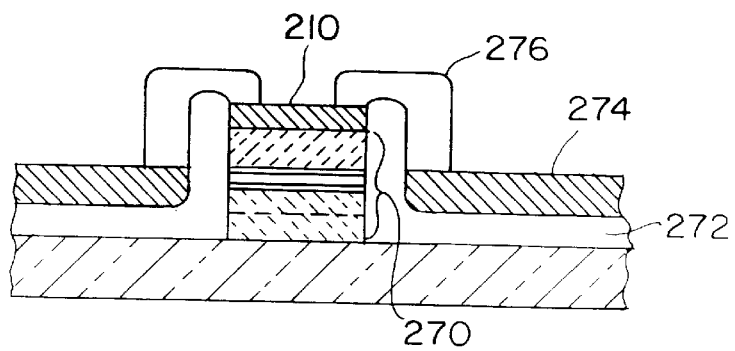
FIG. 9 is a lateral cross-sectional view of the second architecture transmission line 200 including connections for d.c. biasing according to the present invention.

Biasing in FIG. 8 is schematically illustrated by the resistor $R_L$ linking the metal signal line 210 to a voltage source $V_{SUPPLY}$. FIG. 9 is a cross-sectional view of the second architecture transmission line 200 illustrating one technique for physically providing bias in a monolithic implementation. Here, the GaAs ridge 270 and metal signal line 210 are electrically isolated from successive layers by a silicon dioxide ($SiO_2$) layer 272. A metal supply voltage conductor 274 is then deposited or grown by a metalization process on this oxide layer. In operation, this supply voltage line 274 is connected to a voltage source $V_{SUPPLY}$. Resistive blocks 276 are then deposited to electrically connect the supply voltage line 274 to the signal line 210 on the GaAs ridge 270. Ideally, the resistive blocks 276 are formed from nichrome or $CrO_2$, which has been deposited and etched back or deposited through a photoresist and lifted off.

Figure 10:
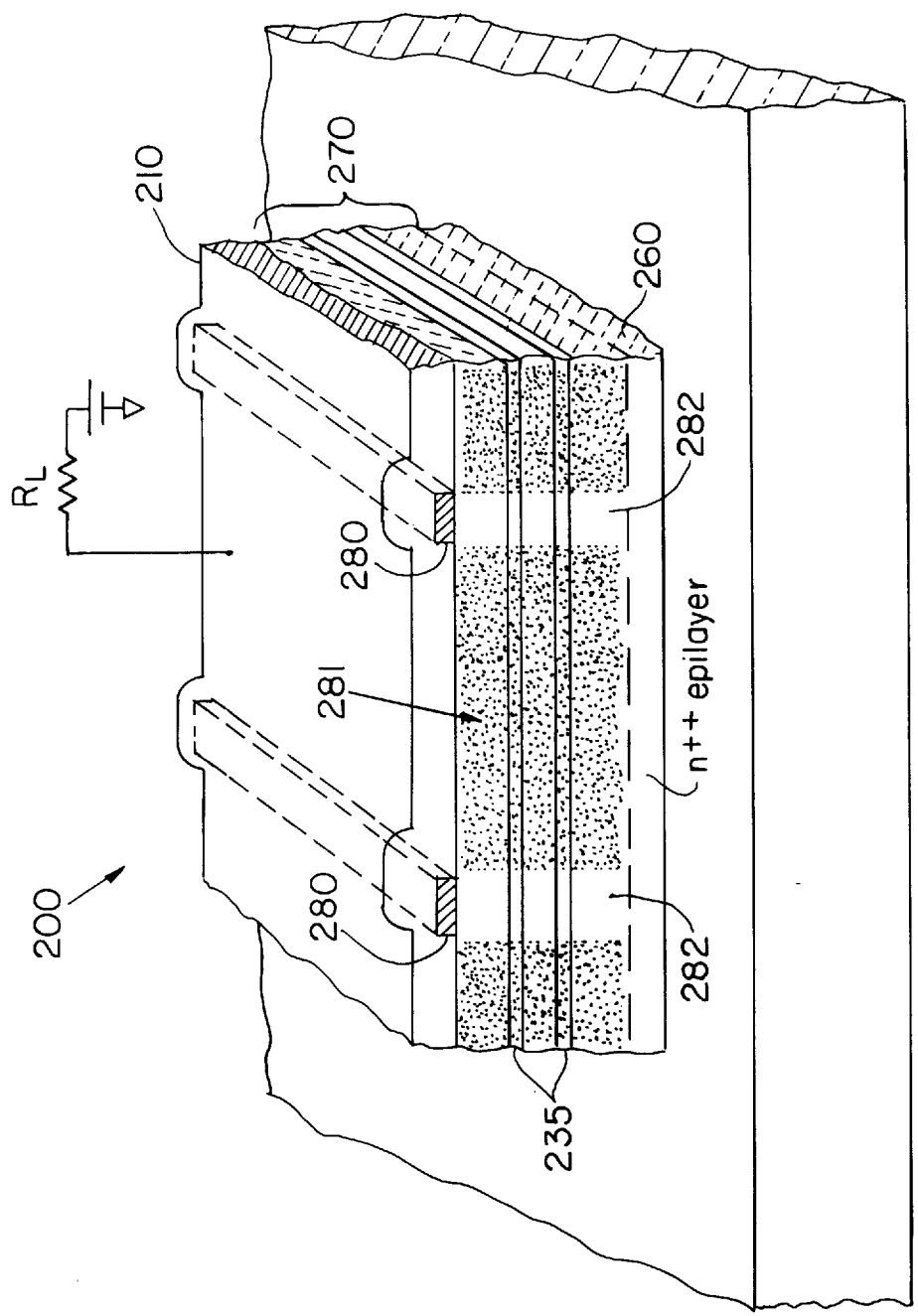
FIG. 10 is a perspective view of a third architecture of the resonant-tunneling transmission line 200 of the present invention implementing discrete resonant-tunneling diodes 282 separated by ion-bombarded regions 281.

In a third architecture of the resonant-tunneling transmission line 200, illustrated in FIG. 10, the essentially continuous-resonant-tunneling diode structure of the second architecture is replaced with a series of discrete diodes, see regions 282, more closely tracking the circuit diagram of FIG. 2 and the first architecture of FIG. 5. Here, only a fraction of the transmission line 200 contains active RTDs, the regions 282 of the GaAs ridge 270 below ohmic metal strips 280. These ohmic metal strips 280 form a mask during an proton bombardment step, which takes place before the deposition of the metal overlay signal line 210. The proton bombardment creates high resistivity regions 281 that effectively inactivate the RTD structure of the GaAs ridge between the metal strips 280. The energies involved in the bombardment must be carefully selected so that the n++ epilayer 260 is left conductive. Compared to the first architecture, the third architecture provides less loss in the transmission line because the load resistor for the RTD switching device is not embedded in the transmission line. Also, the third configuration is simpler because a single resistor can load all of the RTD switches on the transmission line.

This third architecture holds certain advantages over the first and second architectures. Compared to the second architecture, the third architecture requires much less overall biasing current. Also, the signal propagation velocity on the signal line is higher because the inactivated regions of the transmission line have a much lower specific capacitance.

As discussed above, the first embodiment is primarily concerned with enabling logic signal transmission between modules or microprocessors in a distributed computing system and the transmission of a common clock signal to each of the modules or microprocessors. The third embodiment of the invention, in contrast, is directed to the distribution of logic signals or a clock signal on a particular chip. The third embodiment is also well suited for new logic and processing functions shown in FIGS. 13–15.

A common problem associated with intra-chip processing revolves around the fact that a common clock signal must be distributed to particular computing chip modules, gates or gate arrays throughout the entire motherboard. The problem is not unique to microprocessors but can also arise in application specific processors (ASICs), signal processors, large memory chips, configurable or reconfigurable gate arrays such as mask programmable gate arrays or field programmable gate arrays. Degradation of logic signals, which are transmitted between modules, logic gates or gate arrays generally does not constitute a criticality in intra-chip circuit design. Since the logic gates are cascaded on a chip, the distances across which the logic signals are transmitted tend to be short, limiting resistive losses and dispersive effects. Instead, processing speed limitations of the circuits arise from the distribution of the clock signal that coordinates the transmission of the logic signals between the parts of the chip.

The clock signal is generally a square wave and as a result contains substantial high-frequency components. The clock signal is generally degraded by the long intra-chip distances it must travel to coordinate the inter-operation of the components of the microprocessor 305.

Figure 11:
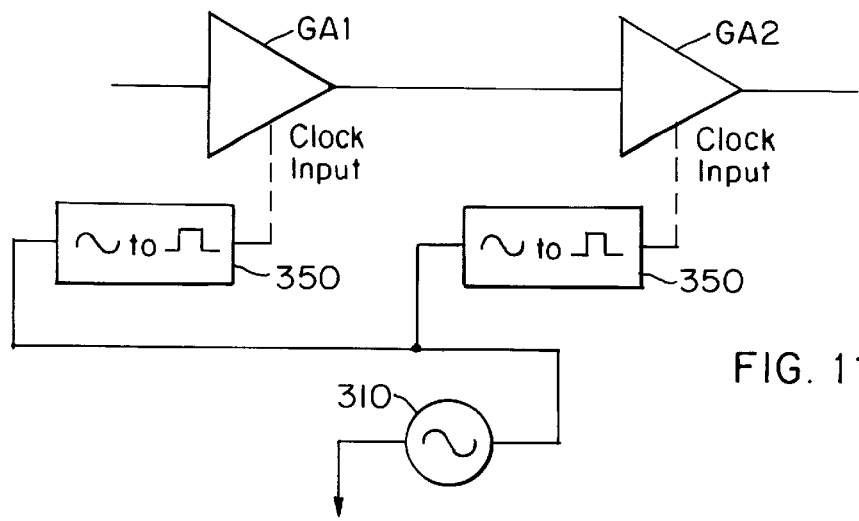
FIG. 11 illustrates the clock signal reconstituting embodiment of the present invention in which a sinusoidal signal is converted to a square wave clock signal at each of the gates or modules of a digital integrated circuit.

FIG. 11 illustrates a clock signal reconstituting network. Basically, the network operates by distributing a sinusoidal clock signal from an on- or off-chip clock to the various intra-chip components or gate arrays GA1, GA2 at which this sinusoid is converted into a square wave. Specifically, the sinusoidal clock generator 310 provides the sinusoidal clock signal to clock signal reconstituting devices 350. The devices 350 convert the sinusoidal clock signal into a square wave, which is used to clock or control the particular microprocessor module, component, or array of gates GA1, GA2.

Each active clock signal reconstituting device 350 is constructed from any one of the resonant-tunneling transmission lines 200 described in connection with FIGS. 3 through 10. More specifically, the phenomenon described in relation to FIG. 4, sinusoid to square wave conversion, is utilized as a natural conversion method for transforming the sinusoidal distribution signal into the square wave clock signal of the same period. As shown in that FIG. 4, the square wave which is generated from the sinusoidal input has the same period as the sinusoidal clock signal.

Figure 12:
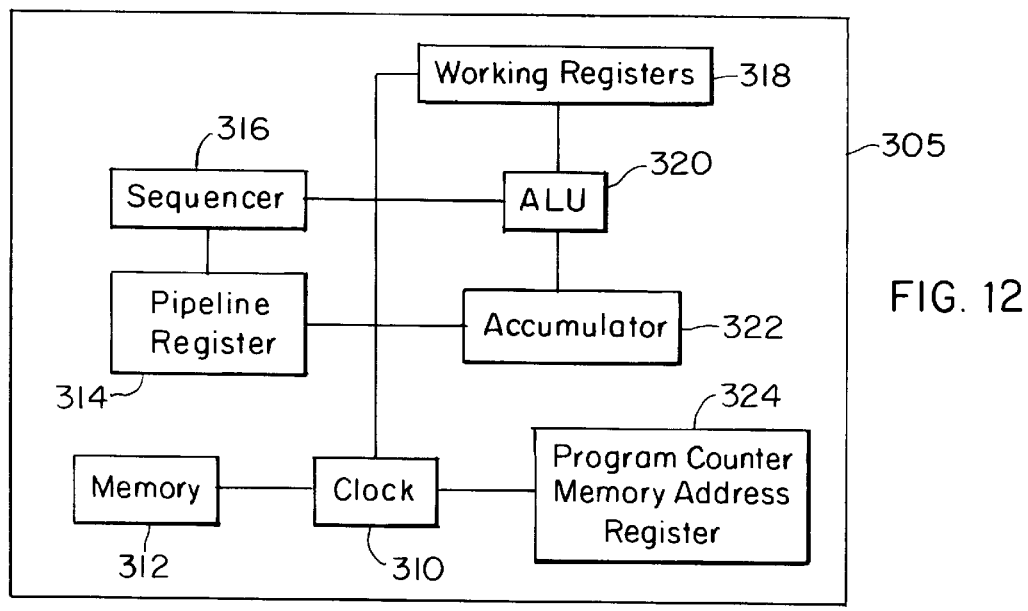
FIG. 12 illustrates the clock signal distribution in an exemplary microprocessor chip as is know in the prior art.

As illustrated in FIG. 12, a central clock 310 controls and coordinates the intra-chip communication between a variety of components within a microprocessor 305, for example. Specifically, the clock signal is commonly provided to an on-chip memory 312, a pipeline register 314, a sequencer 316, working registers 318, an arithmetic logic unit 320, an accumulator 322, and a program counter memory address register 324. Still further, even within the arithmetic logic unit 320, for example, transmission of logic signals between various gate arrays performing components of a given calculation may occur on different clock cycles. Consequently, the transmission of the logic signals between these arrays of gate within a microprocessor module must be coordinated to the clock signal which, because it is a sinusoid, can have a higher frequency.

A number of advantages are associated with distributing a sinusoidal clock signal instead of a square wave. First, since the sinusoid consists of only a single frequency, the dispersive effects of the transmission lines conveying the clock signal do not lead to distortion of the sinusoidal characteristics. Moreover, the conversion of the sinusoid into the square wave can happen quickly and be accomplished in a small surface area of the chip. The length of the resonant-tunneling transmission line 200 necessary to convert the sinusoid into the square wave can be accomplished in as little as an 8×20 micron area.

Figure 13:
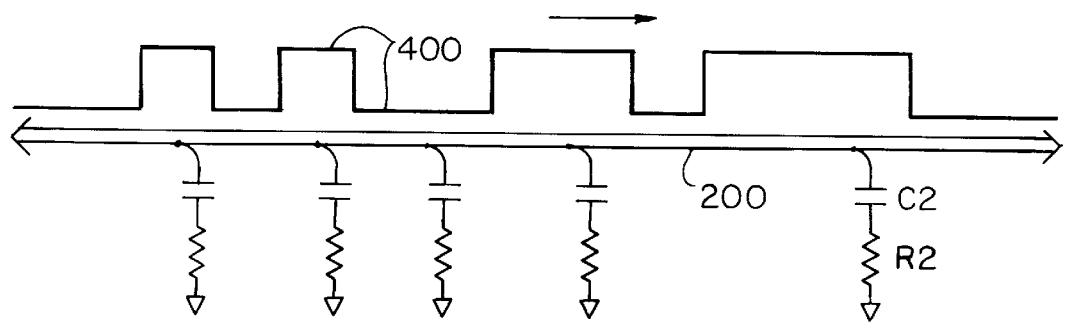
FIG. 13 illustrates the propagation of logic signals 400 on a resonant-tunneling transmission line 200 and a series capacitance C2 and resistance R2 which are coupled to the transmission line 200 to slow and/or stop the propagation of the logic signals according to the present invention.

A third embodiment of the present invention is directed to a data storage device based upon the resonant-tunneling transmission lines 200 described, preferably in connection with the third architecture of FIG. 10. Referring to FIG. 13, if one considers the resonant-tunneling transmission line 200 and a series of logic signals 400 propagating along the transmission line 200. The propagation of these signals 400 can be frozen and held in the resonant-tunneling transmission line 200 by selectively connecting lossy components such as series combinations of a resistor R2 and capacitor C2 along the length of the transmission line 200. The coupling to the resonant-tunneling transmission line 200 slows and/or stops the pulse train at each of the resonant-tunneling diodes along the line 200 by filtering any a.c. changes associated with propagation of the logic signals 400.

Figure 14:
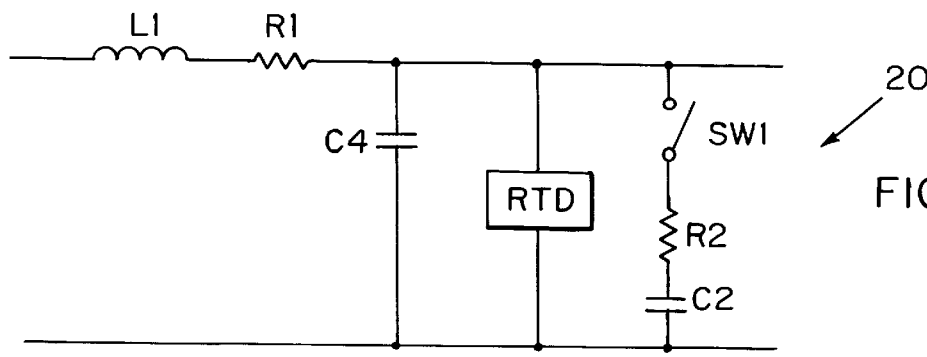
FIG. 14 is a circuit diagram of the logic signal freezing system of the present invention.

As better illustrated in FIG. 14, the resonant-tunneling transmission line 200, comprising discrete RTDs, can statically support high and low voltage states simultaneously at different regions of the same transmission line 200. These states need not be time changing. As a result, it is possible to stop the propagation of a set of logic signals 400 moving along the transmission line 200 without excessive signal distortion. As shown in FIG. 14, an incremental portion of resonant-tunneling transmission line 200 can be approximated by an RTD with a parallel capacitance C1, a series inductance L1, and a resistance R1, which represents the signal line resistance between RTDs. Resistance R1 dictates the distance between RTDs of different logic states. An additional resistance R2 and capacitance C2 are added and selectively placed in parallel to the RTD. In this configuration, when the switch SW1 is open, the resonant-tunneling transmission line 200 behaves as described previously for FIG. 10, enabling logic signal transmission. When the switch SW1 is closed, however, the movement of the signal 400 is damped by resistor R2 and the capacitor C2 coupling the a.c. components to ground.

Specifically, the resistance of R2 is selected so that the dynamic loss dissipated by resistor R2 exceeds the gain associated with the RTD. This is achieved when resistor R2 is less than the magnitude of the negative resistance of the RTD. In this situation, the signal propagation along the line will be damped and the signal will eventually stop. Basically, the resistor and series capacitor C2 pass the a.c. component of the logic signal propagating on the transmission line 200 to ground. When the switch SW1 is open again, the signal is accelerated to its original propagation speed. As a result, logic signals transmitted between chips, for example, can be frozen and then restarted. Alternatively, the transmission line 200 can be implemented as a general high speed serial data storage or memory device. The resistor R1 is the incremental resistance of the signal line 215 between the active RTDs.

Figure 15:
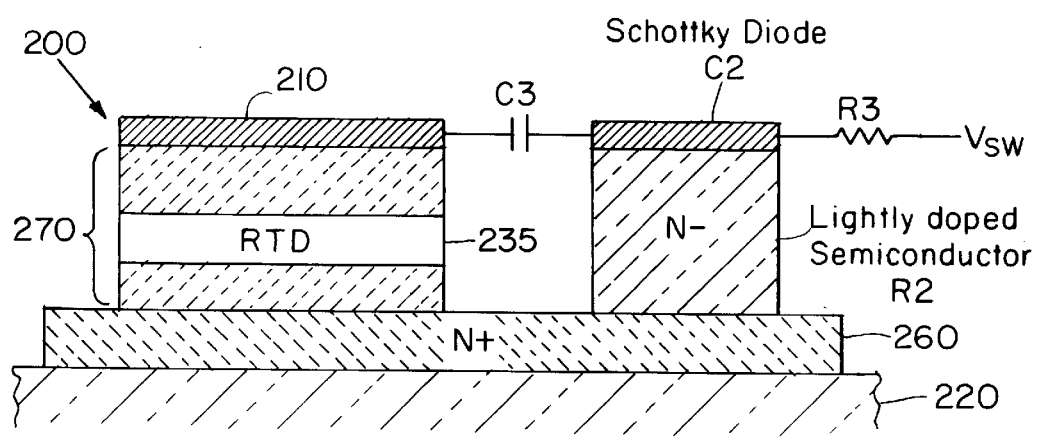
FIG. 15 shows a monolithic implementation of the logic signal freezing system of the present invention.

FIG. 14 shows a monolithic realization of the data propagation freezing device of FIG. 15. Specifically, the resonant-tunneling transmission line 200, shown in cross-section, is capacitively coupled by a capacitor C3 to a Schottky diode, which functions as capacitor C2 of FIG. 14. This Schottky diode C2 is formed on a lightly doped n⁻ GaAs layer which functions as the resistor R2 of FIG. 14. An n⁺⁺ epilayer is a ground plane which then couples this resistor R2 and the transmission line 200 to a ground potential. The voltage on the Schottky diode is determined by a switching voltage $V_{SW}$ through an isolating resistor R3. When the switching voltage $V_{SW}$ is negative, the capacitance of the Schottky diode C2 is so small as to not affect the propagation of the logic signals on the transmission line 200. This situation is equivalent to an open state of the switch SW1 is FIG. 14. When the voltage $V_{SW}$ is 0 or slightly positive, the capacitance of the Schottky diode C2 is large resulting in a large coupling to the transmission line 200. This situation corresponds to the closure of switch SW1 in FIG. 14. The capacitance of the Schottky diode C2 and the resistance of the semiconductor R2 below it, damps the logic signal movement on the transmission line 200. Thus, the propagation of the logic signal is stopped or frozen. Subsequent changes in the voltage $V_{SW}$ causes the acceleration and propagation of the logic signals once again.

Figure 16:
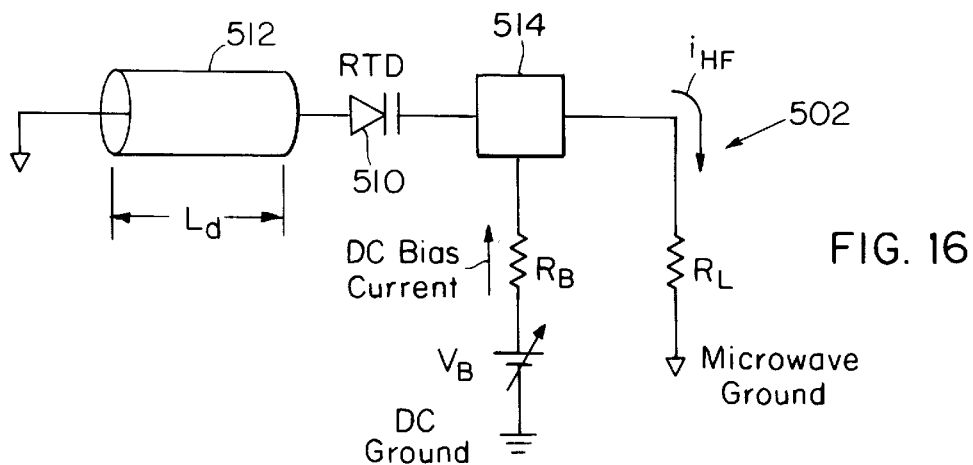
FIG. 16 is a prior art resonant-tunneling transmission line relaxation oscillator 502.

A fourth embodiment of the present invention is best understood by a preliminary discussion of a prior art resonant-tunneling transmission line relaxation oscillator 502 of FIG. 16. This relaxation oscillator 502 was first proposed by a presently named inventor in an article entitled "Resonant-Tunneling Transmission-Line Relaxation Oscillator", *OSA Proceedings on Ultrafast Electronics and Optoelectronics, Optical Society of America,* 1993, Vol. 14, pages 91–94. The oscillator 502 is based upon the repetitive switching through the NDR region of a RTD 510 between d.c. stable points lying below the peak point and above the valley point. The RTD 510 is connected to one end of a short-circuited standard transmission line 512. The transmission line 512 has a characteristic impedance $Z_0$ and an electrical time delay $t_d$. The RTD 510 is d.c. biased through a bias resistor $R_B$ with a variable supply voltage $V_B$. A quiescent operation point is initially set to just below the peak or just above the valley and the RTD 510 is induced to switch toward the valley or peak, respectively, by a slowly applied voltage ramp on $V_B$. Once this first switch occurs, a pulse travels down the transmission line 512, is reflected from the short with an inverted polarity and arrives back at the RTD 510 after a time 2 $t_d$. If 2 $t_d$ is substantially greater than the RTD switching time $t_s$, then the return pulse will induce the RTD 510 to switch back to the initial operating point. The subsequent return pulse then induces a switch similar to the first one, and the process repeats itself at a rate of $(4\ t_d)^{-1}$. The overall process is classified as a relaxation oscillation because the RTD 512 dwells for a finite time in both of its NDR regions between switching events. A bias tee 514 provides a three port connection between the RTD, the bias resistor $R_{B1}$ and an a.c. load resistor $R_L$ to provide the d.c. bias current to the RTD 510 without hindering the high frequency behavior. The high-frequency signal $i_{HF}$ then flows directly to the load resistor $R_L$. Impulse functions are very hard to generate by any other purely electronic means. The output signal comprises a series of alternating negatively and positively going impulse functions.

Figure 17:
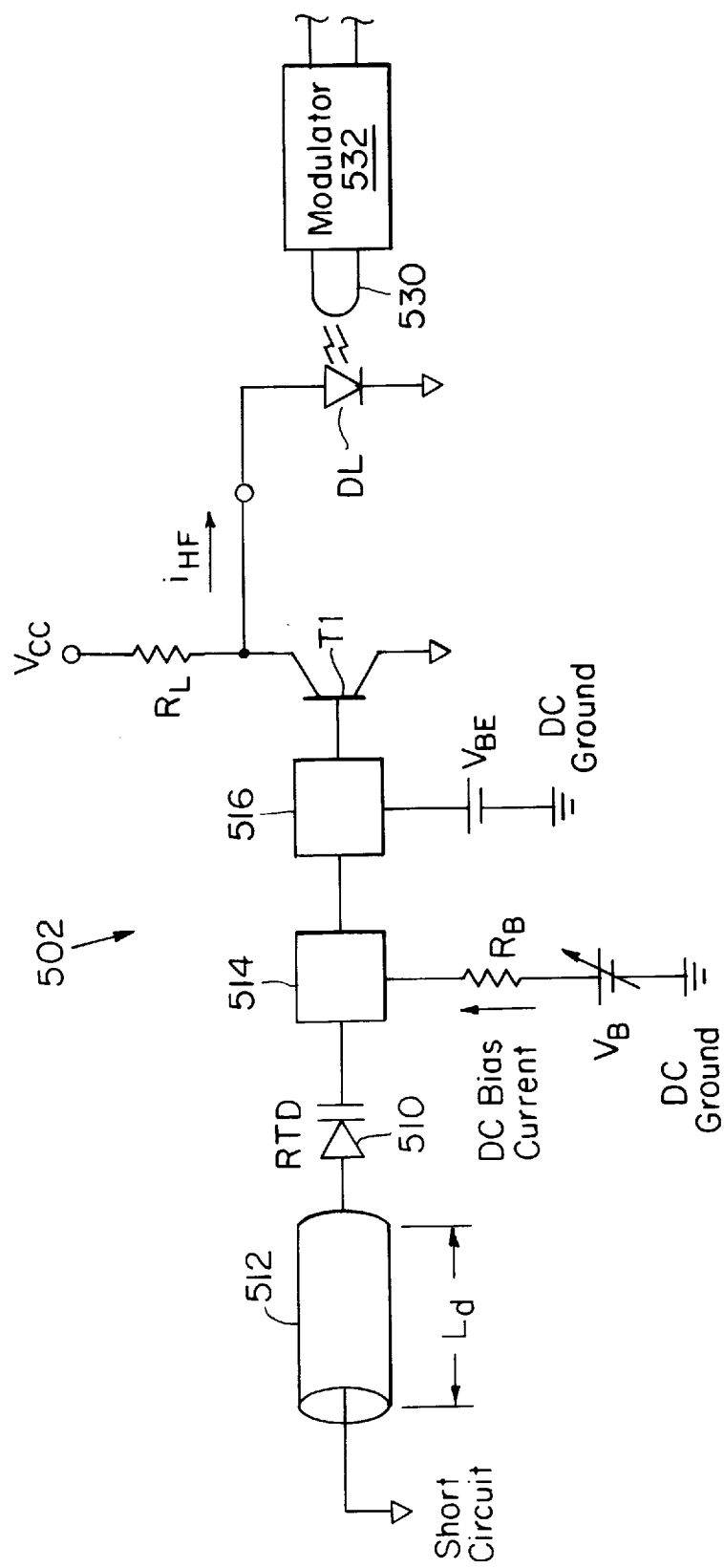
FIG. 17 shows the relaxation oscillator 502 implemented in a Class B amplifier configuration as a driver for a laser diode.

In a first implementation of the fourth embodiment, the relaxation oscillator 502 is incorporated as a driver for a laser diode $D_L$ as shown in FIG. 17. Light generated by this diode $D_L$ is coupled into a fiber optic cable 530 transmitting the light to a modulator 532 which amplitude modulates the light signal. To drive the laser diode efficiently, only one polarity of the impulse functions must occur. This is accomplished by first feeding the output from the relaxation oscillator 502 into a NPN bipolar junction transistor (BJT) T1 connected as a class B amplifier. Alternatively, the transistor T1 could be enhancement-mode field-effect transistor (E-FET). The collector of the BJT is connected to a biasing transistor $R_L$ connected to a voltage supply $V_{cc}$ and has an emitter connected to a microwave frequency ground. As a Class B amplifier, the transistor drain or collector current is normally zero and turns on only when a positive-going pulse arrives at the input, the gate or base. For a negative-going input pulse, the output voltage of the Class-B amplifier remains unchanged. The amplifier configuration also provides a certain degree of gain associated with the transistor T1. A voltage source $V_{BE}$, connected to a D.C. ground, is connected by a second bias tee 516 to the base of the BJT transistor T1 to provide base-emitter biasing. In the alternative implementation using the enhancement-mode field-effect transistor, this bias tee 516 and transistor biasing voltage source is not necessary.

Figure 18:
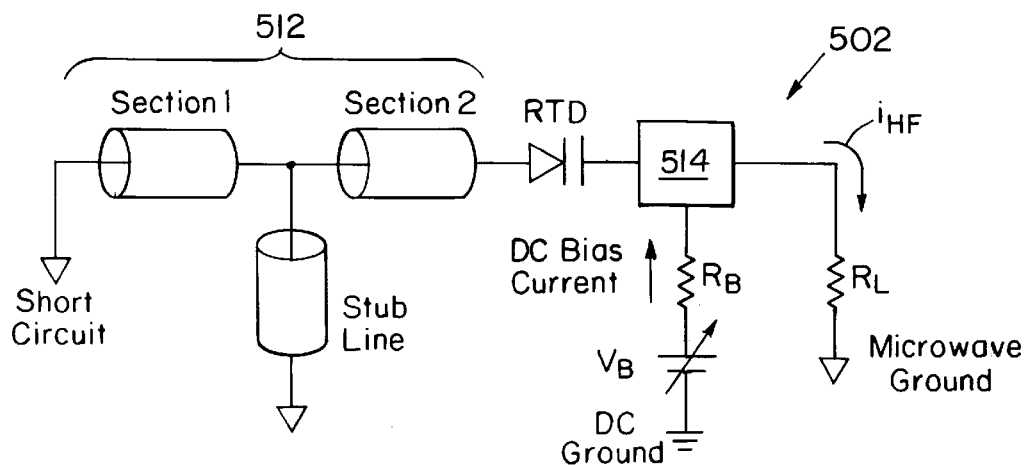
FIG. 18 illustrates a function generator constructed by modifying the transmission line characteristics of the relaxation oscillator 502.

In a second implementation, FIG. 18, of this fourth embodiment, the characteristics of the transmission line 512 can be modified to shape the output of the relaxation oscillator 502. More specifically, the transmission line 512 can be divided into sections, section 1, section 2, and a stub line. The stub line is placed a certain distance along the transmission line 512 to introduce a reflection at this point. When properly placed various functions such as square waves can be produced for the high frequency waveform $i_{HF}$.

Figure 19:
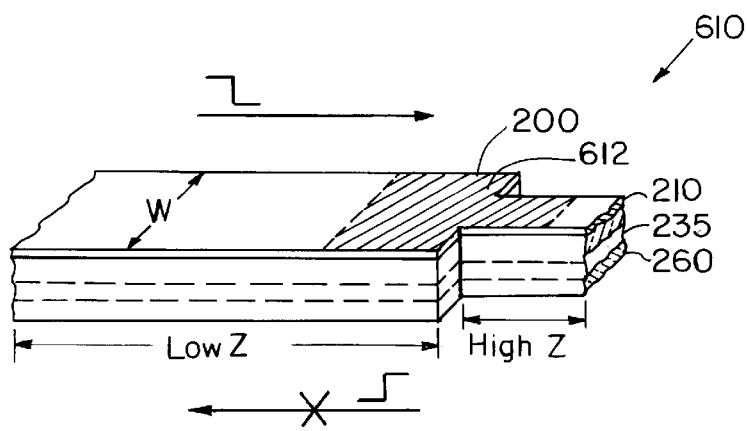
FIG. 19 is a perspective view of an isolator for restricting the signal propagation in the resonant-tunneling transmission line 200 to one direction.

A sixth embodiment of the present invention is based upon an isolator 610 illustrated in FIG. 19. This isolator represents a portion of the resonant-tunneling transmission line 200 including a signal line 210, epilayer 260 providing a ground line, and resonant tunnel diode heterostructure 235. The transmission line 200 is constructed with a stepped width W. This stepped width restricts the propagation of logic signals to only a single direction. Specifically, as schematically illustrated in FIG. 19, a step voltage function can propagate from the left to the right, or from a low impedance (Z) side to a high Z side of the transmission line 200. In contrast, a step function transmitted from the right to the left is blocked from further transmission on the transmission line at the step.

The uni-directional propagation effect is based upon the different characteristic impedance of the two widths of the transmission line 200. For a generalized transmission line, composed of capacitances, inductances, and resistances, which are not dependent on the voltage in the transmission line, the transmission of a signal can occur in either direction along the line. In contrast, in the transmission line 200 of the present invention, the RTDs have a resistance that are dependent on the voltage across the transmission line. For a signal to be transmitted without attenuation on the transmission line 200, a threshold voltage must be exceeded. For example, assume that the transmission line is in the low voltage state, 0.2 V, where the high voltage state is 1 V. To cause a transmission to the high voltage state, initial input voltage of greater than or equal to about 0.7 V must be supplied to cause this transition. If the signal is below this threshold, then the RTD of the transmission line 200 will not change state and the signal will be attenuated. First assume that the transmission line is in a low state and a voltage sufficient for transmission is supplied on the high Z side of the transmission line. Because of the transmission line's narrow width, high transmission line impedance, it cannot supply sufficient current to the wider low Z side of the transmission line to surpass the threshold voltage. As a result, no signal can be transmitted from the right to the left. However, since the low-Z side of the transmission line is wider, it can supply a sufficient current to the high Z side to cause it to switch to the higher voltage state. In a similar vein, a gradually widening transmission line allows for the continuous transmission of the voltage step since the narrower transmission line can supply the current for the marginally wider next segment. The effect is the same for transitions from high voltage to a low voltage state. It should also be noted that the area of the RTD needs to only cover the stepped junction area 612, i.e., a continuous heterostructure is not necessary.

Figures 20A, 20B:
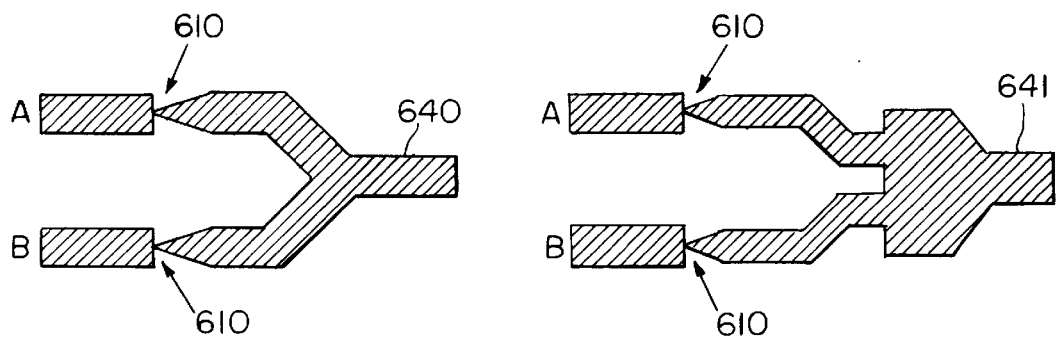
FIG. 20a and 20b illustrate an OR gate and an AND gate constructed by controlling the widths of a continuous resonant-tunneling transmission line at a two input line intersections according to the present invention.

Referring to FIGS. 20a and 20b, the isolator 610 is used to construct isolated logic gates constructed from the transmission line 200. Specifically, FIG. 20a illustrates an OR gate implementation in which two isolators inhibit reflection to a prior logic device. Since the output line 640 has a narrow width, either input line A or B will drive the output line 640. FIG. 20b illustrates an AND gate implementation. Since the output line segment 641 has a large stepped width compared to the input lines A and B only when the logic signals on lines A and B combine, will the state of the output line change.

While this invention has been particularly shown and describe with references to preferred embodiments thereof, it will be understood by those skilled in the art that various changes in form and details may be made therein without departing from the spirit and scope of the invention as defined by the appended claims.

We claim:

1. An integrated negative differential resistance device transmission line comprising:
    a heterostructure layer;
    a signal line for transmitting logic signals along a length of the heterostructure layer;
    a supply voltage line and a reference voltage line for providing biasing to the heterostructure layer;
    switching device conductive links that extend between the signal line and the reference voltage line and include the heterostructure layer to provide switching devices along the transmission line; and
    load device conductive links that extend between the signal line and the supply voltage line and include the heterostructure layer to bias the switching devices for bi-stable operation.

2. A negative differential resistance device transmission line as claimed in claim 1, wherein the supply voltage line and the reference voltage line are disposed on either side of the signal line.

3. A negative differential resistance device transmission line as claimed in claim 1, wherein regions of the heterostructure layer have been inactivated to provide discrete resonant-tunneling diodes along a length of the signal line.

4. A negative differential resistance device transmission line as claimed in claim 1, wherein the heterostructure layer is formed on a semiconductor substrate which has been etched to leave the heterostructure layer on a ridge of the substrate.

5. A negative differential resistance device transmission line as claimed in claim 4, wherein the signal line is located on the ridge over the heterostructure layer.

6. A negative differential resistance device transmission line as claimed in claim 5, wherein the signal line is formed by a metalization process.

7. A negative differential resistance device transmission line as claimed in claim 4, wherein the supply voltage line and reference voltage line are located over etched regions of the substrate adjacent to the signal line.

8. A negative differential resistance device transmission line as claimed in claim 4, wherein the supply and reference voltage lines are formed by a metalization process on the substrate.

9. A negative differential resistance device transmission line as claimed in claim 4, wherein the supply voltage line and reference voltage line are located over etched regions of the substrate on either side of the signal line.

10. A negative differential resistance device transmission line as claimed in claim 4, wherein regions of the substrate and heterostructure layer are inactivated to provide the load device conductive links and the switching device conductive links.

11. A negative differential resistance device transmission line as claimed in claim 1, wherein the signal line is formed on a ridge of gallium arsenide.

12. A negative differential resistance device transmission line as claimed in claim 3, wherein the regions have been inactivated by proton implantation.

13. A resonant-tunneling transmission line comprising:
    a resonant-tunneling heterostructure;
    a signal line, vertically aligned over the resonant-tunneling heterostructure, for transmitting logic signals; and
    a reference voltage line, vertically aligned under the resonant-tunneling heterostructure, for carrying a reference voltage for the resonant-tunneling heterostructure.

14. A resonant-tunneling transmission line as claimed in claim 13, wherein the reference voltage line is a ground voltage line.

15. A resonant-tunneling transmission line as claimed in claim 13, further comprising a supply voltage line, adjacent to the signal line, for providing a supply voltage to the signal line through a resistive load.

16. A resonant-tunneling transmission line as claimed in claim 13, further comprising inactivated portions of the resonant-tunneling heterostructure to thereby form discrete resonant-tunneling diodes along a length of the resonant-tunneling transmission line between the signal line and the reference voltage line.

17. A resonant-tunneling transmission line as claimed in claim 16, wherein the inactivated portions of the resonant-tunneling heterostructure are formed by proton implantation.

18. A resonant-tunneling transmission line as claimed in claim 13, wherein the resonant-tunneling heterostructure is formed in a semiconductor ridge located on a semiconductor substrate.

19. A resonant-tunneling transmission line as claimed in claim 13, wherein the resonant-tunneling heterostructure is formed in a semiconductor ridge located on a substrate and isolated from the substrate by mesa isolation.

20. A resonant-tunneling transmission line as claimed in claim 13, wherein the reference voltage line is an epilayer formed on a semiconductor substrate.

21. A resonant-tunneling transmission line as claimed in claim 13, wherein the signal line is formed by a metalization process.

22. A resonant-tunneling transmission line as claimed in claim 17, wherein the inactivated portions of the resonant-tunneling heterostructure are defined by a masking layer formed over the heterostructure.

23. A variable speed data transmission line, comprising:
a resonant-tunneling transmission line for transmitting data;
a plurality of series connected capacitances and resistances distributed alone a length of the transmission line providing an a.c. path to a reference potential; and
switching circuits that selectively couple the series capacitances and resistances to the transmission line to affect the speed of signals propagating on the transmission line.

24. A variable speed data transmission line as claimed in claim 23, wherein the resonant-tunneling transmission line comprises:
a signal line for transmitting the data; and
a resonant-tunneling diode heterostructure formed along the signal line.

25. A variable speed data transmission line as claimed in claim 23, wherein the capacitances are provided by Schottky diodes.

26. A variable speed data transmission line as claimed in claim 23, wherein the resistances damp gain associated with the resonant-tunneling transmission line.

27. A variable speed data transmission line as claimed in claim 23, wherein the resonant-tunneling transmission line is formed on semiconductor ridge over a semiconductor substrate.

28. A variable speed data transmission line as claimed in claim 23, further comprising an epilayer formed under the transmission line.

29. A variable speed data transmission line as claimed in claim 23, wherein the resistances are formed from a resistive semiconductor ridge adjacent to the transmission line.

30. A variable speed data transmission line as claimed in claim 29, further comprising an epilayer formed under the transmission line and resistive semiconductor ridge.

31. A resonant-tunneling transmission line comprising:
a resonant-tunneling heterostructure;
a signal line, vertically aligned over the resonant-tunneling heterostructure, for transmitting logic signals orthogonally to and along the resonant-tunneling heterostructure; and
a reference voltage line, vertically aligned under the resonant-tunneling heterostructure, for carrying a reference voltage along a length of the resonant-tunneling heterostructure.

* * * * *